United States Patent [19]
Krasner

[11] Patent Number: 5,831,574
[45] Date of Patent: Nov. 3, 1998

[54] METHOD AND APPARATUS FOR DETERMINING THE LOCATION OF AN OBJECT WHICH MAY HAVE AN OBSTRUCTED VIEW OF THE SKY

[75] Inventor: Norman F. Krasner, San Carlos, Calif.

[73] Assignee: SnapTrack, Inc., San Jose, Calif.

[21] Appl. No.: 723,219

[22] Filed: Oct. 7, 1996

Related U.S. Application Data

[63] Continuation-in-part of Ser. No. 612,669, Mar. 8, 1996, Pat. No. 5,663,734, and a continuation-in-part of Ser. No. 652,833, May 23, 1996.

[51] Int. Cl.⁶ .................................................. G01S 5/02
[52] U.S. Cl. .............................................. 342/357; 701/213
[58] Field of Search ................................. 342/357, 457; 455/12.1; 701/213

[56] References Cited

U.S. PATENT DOCUMENTS

| | | | |
|---|---|---|---|
| 4,445,118 | 4/1984 | Taylor et al. | 343/357 |
| 4,457,006 | 6/1984 | Maine | 455/264 |
| 4,601,005 | 7/1986 | Kilvington | 364/602 |
| 4,701,934 | 10/1987 | Jasper | 375/1 |
| 4,785,463 | 11/1988 | Jane et al. | 375/1 |
| 4,797,677 | 1/1989 | MacDoran et al. | 342/352 |
| 4,910,752 | 3/1990 | Yester, Jr. et al. | 375/75 |
| 4,959,656 | 9/1990 | Kumar | 342/418 |

(List continued on next page.)

FOREIGN PATENT DOCUMENTS

| | | |
|---|---|---|
| 447978A2 | 9/1991 | European Pat. Off. |
| 0508405 | 10/1992 | European Pat. Off. |
| 508405A1 | 10/1992 | European Pat. Off. |
| 545636A1 | 6/1993 | European Pat. Off. |
| 601293A3 | 6/1994 | European Pat. Off. |
| 273218 | 6/1994 | United Kingdom . |
| WOA9414081 | 6/1994 | WIPO . |
| WO9428434 | 12/1994 | WIPO . |
| 9740398 | 10/1997 | WIPO . |

OTHER PUBLICATIONS

Benjamin Peterson, et al. "GPS Receiver Structures for the Urban Canyon" ION–GPS–95, Session C4, Land Vehicular Applications, Palm Springs, CA, Sep. 1995.

F.H. Raab et al. "An Application of the Global Positioning System to Search and Rescue and Remote Tracking" Navigation, vol. 24, No. 3 pp. 216–228 Fall 1977.

PCT International Search Report mailed Mar. 10, 1997.

Robert G. Davenport "FFT Processing of Direct Sequence Spreading Codes Using Modern DSP Microprocessors" IEEE 1991 Naecon vol. 1, pp. 98–105 May 20–24 1997.

(List continued on next page.)

*Primary Examiner*—Thomas H. Tarcza
*Assistant Examiner*—Dao L. Phan
*Attorney, Agent, or Firm*—Blakely, Sokoloff, Taylor & Zafman

[57] ABSTRACT

A positioning sensor receives and stores a predetermined record length of positioning signals while in a fix position located such that the positioning sensor can receive positioning signals. Thereafter, the stored positioning signals are processed to determine the geographic location of the fix position. The fix position may correspond to a location of an object of interest or it may be in a known location relative to the position of the object, in which case once the geographic location of the fix position has been computed, the geographic location of the object can be derived. The positioning sensor includes a Snapshot GPS receiver which may collect and process GPS signals transmitted by GPS satellites using fast convolution operations to compute pseudoranges from the GPS satellites to the fix position. Alternatively, these computations may be performed at a basestation. The computed pseudoranges may then used to determine the geographic location of the fix position. The positioning sensor may be equipped with depth sensing means, such as a pressure sensor, which allows a determination of the depth of submerged object to be made. The positioning sensor may further be equipped with signal detecting means for determining when the positioning sensor is in the fix position.

14 Claims, 12 Drawing Sheets

U.S. PATENT DOCUMENTS

| | | | |
|---|---|---|---|
| 4,998,111 | 3/1991 | Ma et al. | 342/352 |
| 5,043,736 | 8/1991 | Darnell et al. | 342/357 |
| 5,119,102 | 6/1992 | Barnard | 342/357 |
| 5,153,598 | 10/1992 | Alves, Jr. | 342/352 |
| 5,202,829 | 4/1993 | Geier | 364/449 |
| 5,223,844 | 6/1993 | Mansell et al. | 342/357 |
| 5,225,842 | 7/1993 | Brown et al. | 342/357 |
| 5,245,634 | 9/1993 | Averbuch | 375/108 |
| 5,271,034 | 12/1993 | Abaunza | 375/1 |
| 5,280,744 | 1/1994 | DeCarlo et al. | 85/41.15 |
| 5,311,194 | 5/1994 | Brown | 342/357 |
| 5,317,323 | 5/1994 | Kennedy et al. | 342/457 |
| 5,323,163 | 6/1994 | Maki | 342/357 |
| 5,323,322 | 6/1994 | Mueller et al. | 364/449 |
| 5,334,987 | 8/1994 | Teach | 342/357 |
| 5,365,450 | 11/1994 | Schuchman et al. | 364/449 |
| 5,379,047 | 1/1995 | Yokev et al. | 342/457 |
| 5,379,224 | 1/1995 | Brown et al. | 364/449 |
| 5,379,320 | 1/1995 | Fernandes et al. | 375/1 |
| 5,389,934 | 2/1995 | Kass | 342/357 |
| 5,416,797 | 5/1995 | Gilhousen et al. | 375/705 |
| 5,420,592 | 5/1995 | Johnson | 342/357 |
| 5,430,759 | 7/1995 | Yokev et al. | 375/202 |
| 5,448,773 | 9/1995 | McBurney et al. | 455/343 |
| 5,483,549 | 1/1996 | Weinberg et al. | 375/200 |
| 5,491,486 | 2/1996 | Welles, II et al. | 342/357 |
| 5,512,902 | 4/1996 | Guthrie et al. | 342/357 |
| 5,523,761 | 6/1996 | Gildea | 342/357 |
| 5,554,993 | 9/1996 | Brickell | 342/357 |
| 5,574,469 | 11/1996 | Hsu | 342/455 |
| 5,592,173 | 1/1997 | Lau et al. | 342/357 |
| 5,594,453 | 1/1997 | Rodal et al. | 342/357 |
| 5,626,630 | 5/1997 | Markowitz et al. | 607/60 |
| 5,633,799 | 5/1997 | Dussell | 364/449.9 |
| 5,650,770 | 7/1997 | Schlager et al. | 340/573 |

OTHER PUBLICATIONS

PCT International Search Report mailed Feb. 21, 1997.

PCT International Search Report mailed May 13, 1997.

RTCM Recommended Standards for Differential Navstar GPS Service, Version 2.0, Jan. 1, 1990.

Rodgers et al. "Animal–borne GPS: Tracking the Habitat" GPS World, pp. 21–22. Jul. 1994.

Navstar GPS User Equipment Introduction. Feb. 1991.

"Navigation"0 Journal of the Institute of Navigation. vol. 25, No. 2. Summer 1978.

PCT International Search Report mailed Jul. 11, 1997.

Pending U.S. Patent Application 08/613,966 Filed: Mar. 8, 1996 entitled: "An Improved GPS Receiver Having Power Management" pp. 1–67.

PCT International Search Report sent Feb. 3, 1997.

METHOD AND APPARATUS FOR DETERMINING THE LOCATION OF AN OBJECT WHICH MAY HAVE AN OBSTRUCTED VIEW OF THE SKY

This application is also a continuation-in-part of application Ser. No. 08/612,669, filed Mar. 8, 1996 now U.S. Pat. No. 5,663,734 and is also a continuation in part of application Ser. No. 08/652,833, filed May 23, 1996.

RELATED APPLICATIONS

This application is related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995.

FIELD OF THE INVENTION

The present invention concerns receivers capable of determining pseudoranges to orbiting satellites and, in particular, concerns such receivers as find application in global positioning satellite systems (GPS).

BACKGROUND

GPS receivers normally determine their position by computing relative times of arrival of signals transmitted simultaneously from a multiplicity of GPS (or NAVSTAR) satellites. These satellites transmit, as part of their message, both satellite positioning data as well as data on clock timing, so-called "ephemeris" data. The process of searching for and acquiring GPS signals, reading the ephemeris data for a multiplicity of satellites and computing the location of the receiver from this data is time consuming, often requiring several minutes. In many cases, this lengthy processing time is unacceptable and, furthermore, greatly limits battery life in micro-miniaturized portable applications.

Another limitation of current GPS receivers is that their operation is limited to situations in which multiple satellites are clearly in view, without obstructions, and where a good quality antenna is properly positioned to receive such signals. As such, they normally are unusable in portable, body mounted applications; in areas where there is significant foliage or building blockage (e.g., urban canyons); in in-building applications and in applications where the location of a submerged object is desired.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates.

Virtually all known GPS receivers utilize correlation methods to compute pseudoranges. GPS signals contain high rate repetitive signals called pseudorandom (PN) sequences. The codes available for civilian applications are called C/A codes and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signal by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the correlation output, the receiver can determine the time delay between the received signal and a local clock. The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth commensurate with a 50 bit per second binary phase shift keyed data signal which is superimposed on the GPS waveform.

The correlation acquisition process is very time consuming, especially if received signals are weak. To improve acquisition time, most GPS receivers utilize a multiplicity of correlators (up to 12 typically) which allows a parallel search for correlation peaks.

Some prior GPS receivers have used FFdT techniques to determine the Doppler frequency of the received GPS signal. These receivers utilize conventional correlation operations to despread the GPS signal and provide a narrow band signal with bandwidth typically in the range of 10 kHz to 30 kHz. The resulting narrow band signal is then Fourier analyzed using FFT algorithms to determine the carrier frequency. The determination of such a carrier simultaneously provides an indication that the local PN reference is adjusted to the correct phase of the received signal and provides an accurate measurement of carrier frequency. This frequency may then be utilized in the tracking operation of the receivers.

U.S. Pat. No. 5,420,592 to Johnson discusses the use of FFT algorithms to compute pseudoranges at a central processing location rather than at a mobile unit. According to that method, a snapshot of data is collected by a GPS receiver and then transmitted over a data link to a remote receiver where it undergoes FFT processing. However, the method disclosed therein computes only a single forward and inverse Fast Fourier Transform (corresponding to four PN periods) to perform the set of correlations.

SUMMARY

One embodiment of the present invention provides a method of determining the location of a submerged object. A positioning sensor is transported to the submerged object and then repositioned to a fix position which is in a known location with respect to the position of the submerged object. The fix position is located such that it provides a location where the positioning sensor can receive positioning signals. The positioning sensor receives and stores a predetermined record length of positioning signals while in the fix position. Thereafter, the stored positioning signals are processed to determine the geographic location of the fix position. Because the location of the submerged object is known relative to the fix position, once the geographic location of the fix position has been computed, the geographic location of the submerged object can be derived.

For one embodiment, the positioning sensor is a Snapshot GPS receiver. The Snapshot GPS receiver is transported to the submerged object by a marine mammal (e.g., a dolphin) or an underwater sled or other transportation device. Once the submerged object has been located, the Snapshot GPS receiver is relocated to a fix position near the surface of the water and above the submerged object. The Snapshot GPS receiver then begins collection of GPS signals transmitted by GPS satellites and stores a predetermined record length of these signals for later processing. The Snapshot GPS receiver includes circuitry which allows the received GPS signals to be downconverted, digitized and stored in memory for later processing. This later processing is accomplished using fast convolution operations on the sampled GPS signals to provide pseudoranges from the GPS satellites to the fix position. The computed pseudoranges may then used to determine the geographic location of the fix position. These calculations can occur within the positioning sensor or at a basestation. Where the calculations are performed at a basestation, the positioning sensor may transmit the pseudoranges to the basestation via a data link or, alternatively, may store the pseudoranges in an onboard memory for later downloading and processing at the basestation. Once the geographic location of the fix position is determined, the geographic location of the submerged object is calculated based on the location of the fix position being above the submerged object. The positioning sensor may be equipped with depth sensing means, such as a pressure sensor, which allows a determination of the depth of submerged object to be made.

A further embodiment allows for the tracking of an object which may have an obstructed or intermittent view of the sky, for example, a marine mammal surfacing at various times, a tumbling object, or a vehicle travelling in an urban or other canyon. For this embodiment, a positioning sensor is periodically located in areas where it is capable of receiving positioning signals. While in these areas, the positioning sensor stores a predetermined amount of data comprising the positioning signals. This data is later processed to determine the location at which it was collected, allowing for the trading of the positioning sensor.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1A:
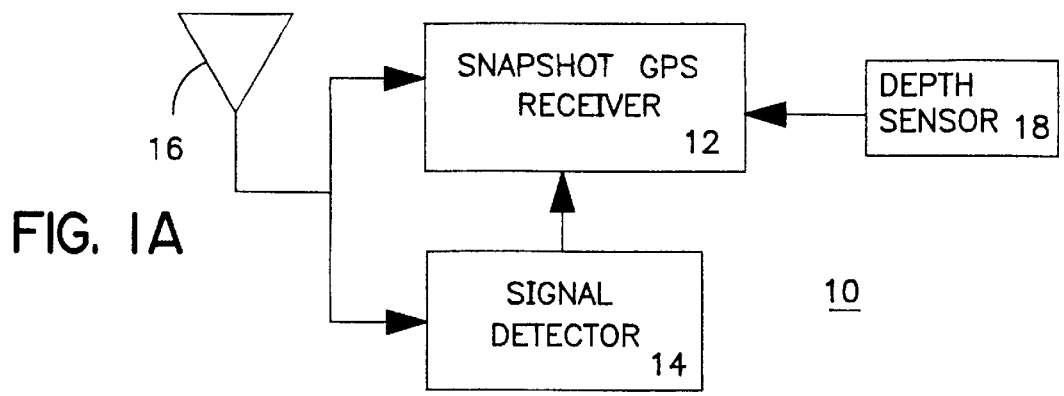
FIGS. 1A–1D are block diagrams illustrating the major components of various embodiments of a positioning sensor utilizing the apparatus and methods of the present invention.

This invention concerns apparatus and methods for computing the location of a submerged or other remote object which may have an obstructed view of the sky using a global positioning system (GPS) receiver with very low received signal levels. As illustrated in FIG. 1A, a positioning sensor 10 has first circuitry for receiving and processing pseudorandom sequences transmitted by a number of GPS satellites. The first circuitry is configured as a Snapshot GPS receiver 12 and is capable of processing the received pseudorandom sequences to determine pseudoranges from the Snapshot GPS receiver 12 to the GPS satellites. The positioning sensor 10 also includes second circuitry coupled to the Snapshot GPS receiver 12. The second circuitry is configured to detect a signal which indicates that Snapshot GPS receiver 12 should take a "fix". That is, the signal indicates that Snapshot GPS receiver 12 should activate its circuitry to receive and store GPS signals transmitted by GPS satellites in the manner described in detail below. Accordingly, the second circuitry is labeled as signal detector 14. As shown, signal detector 14 and Snapshot GPS receiver 12 may share a common antenna 16. In other embodiments, such as that illustrated in FIG. 1B, signal detector 14 and Snapshot GPS receiver 12 may have separate antennas. In yet other embodiments, for example as shown in FIG. 1D, where signal detector 14 is configured to respond to non-RF signals (e.g., pressure signals, light intensity signals, etc.), signal detector 14 will use an appropriate sensor 15 (e.g., a pressure sensor, a light sensor, etc.) in place of an antenna.

Positioning sensor 10 may also be equipped with depth sensor 18 Depth sensor 18 is coupled to Snapshot GPS receiver 12 and is configured to provide information concerning the depth of positioning sensor 10 when positioning sensor 10 is used to locate submerged objects. Depth sensor 18 may be a pressure sensor and may be the same sensor as signal detector 14 in some embodiments, as illustrated in FIG. 1C. As positioning sensor 10 is transported beneath the surface of the water to the submerged object, depth sensor 18 will periodically report depth information to Snapshot GPS receiver 12. This information may be stored for later use in the determination of the location of the submerged object. In addition, for embodiments where depth sensor 18 also provides the functionality of signal detector 12, these pressure signals may be used to indicate when Snapshot GPS receiver 12 is at or near the surface of the water (and, hence, its associated antenna 16 will have a relatively clear view of at least some GPS satellites) and should take a fix, as described below.

Snapshot GPS receiver 12 processes the received pseudorandom sequences by digitizing and storing GPS data made up of a predetermined record length of the received pseudorandom sequences. Once the GPS data has been stored, Snapshot GPS receiver 12 may perform fast convolution operations on the stored data to determine the pseudoranges. The manner in which these computations are performed is discussed in detail below. Alternatively, these computations may be performed at a basestation after the information collected by Snapshot GPS receiver has been downloaded. Note that pseudoranges may be used to compute the geographical position of positioning sensor 10 in many different ways. Three examples are:

Method 1: By providing the Satellite Data Message (or some portion thereof) to the Snapshot GPS receiver 12 from a basestation 50 (see FIGS. 2 and 3F), Snapshot GPS receiver 12 may combine this information with the pseudorange measurements to compute its position. See, for example, U.S. Pat. No. 5,365,450, which is incorporated herein by reference. The Satellite Data Message may be provided at the time positioning sensor 10 is initialized or it may be provided across a data or other communication link in situations where Snapshot GPS receiver 12 includes a modem or other similar communication device (see, e.g., FIG. 3E) while positioning sensor 10 is in an operating area.

Method 2: Snapshot GPS receiver 12 may gather satellite ephemeris data from the reception of GPS signals in the normal manner that is commonly practiced in the art. This data, which typically is valid for one to two hours, may be combined with pseudorange measurements to complete the position calculation.

Method 3: Snapshot GPS receiver 12 may transmit the computed pseudoranges to basestation 50 over a data link or this information may be downloaded at basestation 50 after the positioning sensor 10 returns from an operating area. A processor at basestation 50 can combine the pseudorange information with satellite ephemeris data to complete the position calculation. See, for example, U.S. Pat. No. 5,225,842, which is incorporated herein by reference. Alternatively, where the pseudorange calculation is performed at the basestation 50, positioning sensor 10 would merely collect raw GPS data for later downloading (via a data link or hard wired connection) and processing at basestation 50 may be completed at a later time.

By combining aspects of Methods 1 and 3 into a hybrid method, that is, by providing Snapshot GPS receiver 12 with satellite ephemeris and/or satellite Doppler information before positioning sensor 10 is transported to the operating area and by allowing the computed pseudoranges to be stored locally at positioning sensor 10 for later downloading and processing, positioning sensor 10 may operate in a self-contained manner. That is, no external communications will be required while positioning sensor 10 is in the operating area. This is advantageous in situations where RF or other transmissions between positioning sensor 10 and basestation 50 might compromise the location of these assets or where such transmissions might be hazardous, for example where positioning sensor 10 is operating in areas where mines or other devices may be sensitive to such transmissions.

In Methods 1 and 3 and in the hybrid method discussed immediately above, basestation 50 requires information regarding the satellites in view of Snapshot GPS receiver 12 at the time fixes are taken. This may be accomplished by knowing approximately the area in which positioning sensor 10 is operating or by ensuring that basestation 50 and Snapshot GPS receiver 12 have a common view of all satellites of interest and are positioned close enough to one another to resolve a time ambiguity associated with the repetition rate of the GPS pseudorandom codes. This latter condition will be met for a range between basestation 50 and Snapshot GPS receiver 12 of ½ times the speed of light times the PN repetition period (1 millisecond), or about 150 km.

Figure 2:
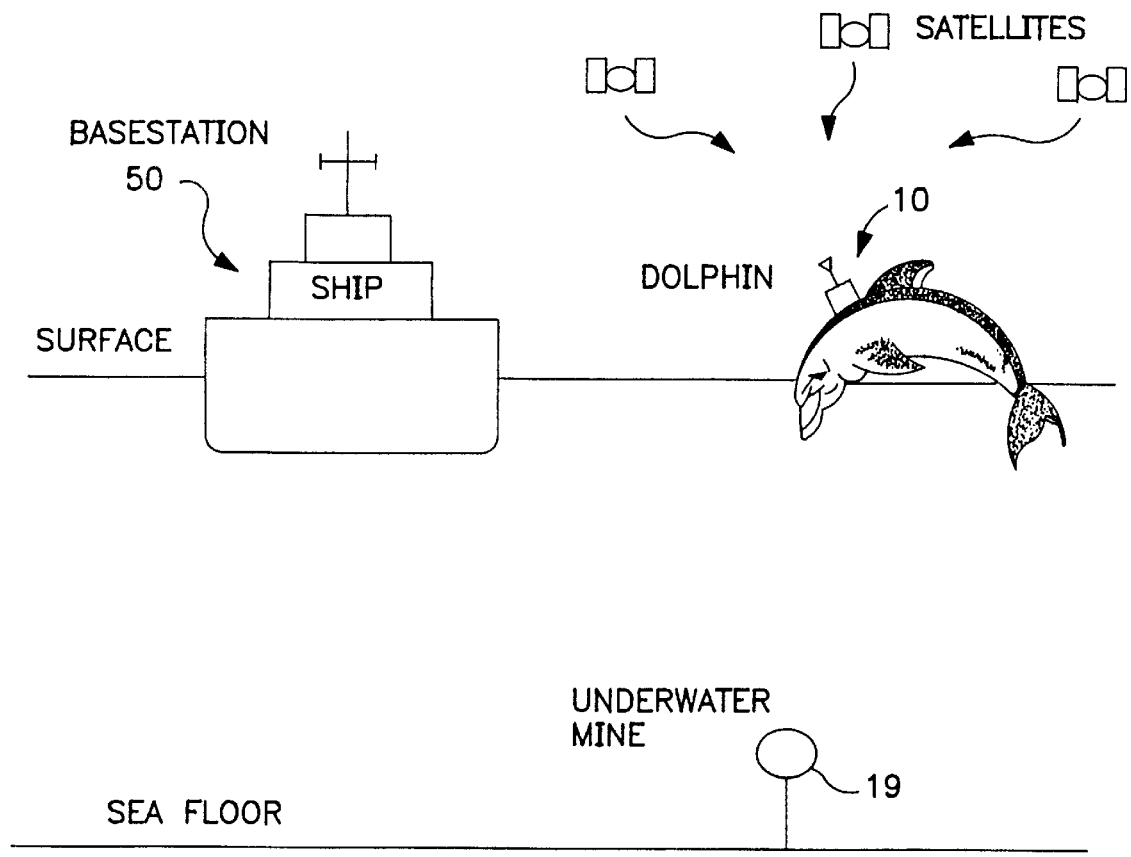
FIG. 2 illustrates one example of the use of a positioning sensor configured according to the present invention to determine the location of a submerged object.

Referring now to FIG. 2, one method of locating a submerged object using positioning sensor 10 will be described. In the following description, it is assumed that positioning sensor 10 is initialized prior to being deployed in an operating area. This initialization involves storing GPS satellite ephemeris and/or Doppler information on-board positioning sensor 10. Such information will allow Snapshot GPS receiver 12 to rapidly compute pseudoranges using the signal processing techniques described in detail below. In other embodiments, such computations may be performed at basestation 50 after positioning sensor 10 returns from the operating area. In such cases, Snapshot GPS receiver 12 will store only raw GPS data and the initialization process is not required. In yet further embodiments, positioning sensor 10 will be equipped with a communication device that allows two way communication with the basestation. In such cases, when Snapshot GPS receiver 12 is ready to take a fix, a signal is transmitted from positioning sensor 10 to basestation 50 and, in response, basestation 50 transmits satellite Doppler information for in-view GPS satellites to positioning sensor 10 to aid in the pseudorange computations. The communication link can also be used to transmit the computed pseudorange information back to basestation 50.

For the embodiment shown in FIG. 2, positioning sensor 10 is used to determine the location of an underwater mine 19. Of course, those skilled in the art will recognize that positioning sensor 10 may be used to assist in the location of any of a number of submerged objects, including sunken vessels, downed submarines, underwater cables, and other items. Using similar approaches, positioning sensor 10 may also be used to determine the location of objects in other areas where traditional GPS receivers have difficulty operating. Such areas include urban canyons, jungles, forests and other areas where only intermittent glimpses of the sky are available or other blockage conditions exist.

Basestation 50 is described in detail below with reference to FIG. 3F. For the embodiment shown in FIG. 2, basestation 50 is located on a ship or other floating vessel which may operate in the vicinity of the area to be explored using positioning sensor 10. For other embodiments, basestation 50 may be located some distance away from the operating area, and may be a shore-based installation. For applications where positioning sensor 10 is used to assist in locating land-based objects, basestation 50 may be housed in an automobile or other land-based vehicle, on a helicopter or at a fixed site.

Once positioning sensor 10 has been initialized, it is transported to the operating area by a transportation means. For the embodiment shown in FIG. 2, this is a dolphin. Of course, other marine mammals could be used as transportation means. In other embodiments, positioning sensor 10 may be part of an underwater sled or other remote controlled vehicle or it could be carried by a human diver who will explore the operating area. In cases where positioning sensor 10 is used to assist in determining the location of land-based objects, other transportation means, such as automobiles, helicopters, remote piloted vehicles, etc., or persons could be used to transport positioning sensor 10.

Where a dolphin or other marine mammal is used, it will be appreciated that special training will be required. Currently, marine mammals are used by various government agencies for applications similar to those required according to the present invention. In addition, marine mammals have long been featured at aquatic parks where they perform tricks which share many of the requirements of the present invention. Thus, the use of marine mammals according to the present invention is not a limiting factor.

Positioning sensor 10 is transported to the operating area and the search for underwater mine 19 begins. The dolphin has been trained to recognize objects that resemble underwater mine 19. When the dolphin recognizes an underwater mine 19, it surfaces at a location immediately above underwater mine 19. Prior to surfacing, the dolphin will swim adjacent to underwater mine 19 so that the depth of mine 19 can be recorded using depth sensor 18.

When the dolphin surfaces, Snapshot GPS receiver 12 will take a fix as described in detail below. Snapshot GPS receiver 12 will be prompted to take such action in response to the receipt of an activation signal at positioning sensor 10. Many types of activation signals can be used and the type of signal used will depend on the configuration of positioning sensor 10. For an embodiment where positioning sensor 10 includes a separate signal detector 14 capable of receiving RF signals (see, e.g., FIGS. 1A and 1B), the activation signal may be an RF signal transmitted from basestation 50 while positioning sensor 10 is in the operating area. Alternatively, the GPS signals transmitted by the GPS satellites may act as activation signals. Signal detector 14 may be circuitry which is capable of detecting the GPS signals. Those skilled in the art will recognize that such signals are severely attenuated at even shallow depths. However, when the dolphin surfaces, antenna 16 (or another antenna used by signal detector 14) will be clear of the water and, hence, the GPS signals (or other activation signal transmitted at or near the GPS signal frequencies) will be detectable. In other embodiments, for example as shown in FIG. 1D, positioning sensor 10 may include a signal detector 14 which responds to other types of activation signals. these signals may include light intensity signals and, accordingly, sensor 15 would be capable of detecting light signals. As the dolphin submerges beneath the water, the amount of ambient light will decrease with depth. However, when the dolphin surfaces (assuming a daytime operation) the amount of ambient light will increase such that signal detector 14 will indicate that positioning sensor 10 is at the surface and, accordingly, a fix should be taken.

A further embodiment, shown in FIG. 1C, uses depth sensor 18 as the means by which Snapshot GPS receiver 12 is signaled to take a fix. In such an embodiment, depth sensor 18 will periodically report depth information to Snapshot GPS receiver 12. When this depth information indicates that positioning sensor 10 is at or near the surface of the water (i.e., indicating that the dolphin has surfaced), Snapshot GPS receiver 12 will take a fix.

After a fix has been taken, if positioning sensor 10 includes a communication device, the computed pseudorange information may be transmitted to basestation 50. This may occur at a subsequent surfacing following the surfacing which triggered the fix operation. Alternatively, the pseudorange information may be stored on-board positioning sensor 10 for later downloading and processing at basestation 50. The dolphin may continue to search the operating area (e.g., a harbor approach) for additional mines or other submerged objects, surfacing (and, hence, causing Snapshot GPS receiver 12 to take a fix) as required.

The pseudorange information thus obtained may be used, together with the depth information from depth sensor 18, to determine the location of the underwater mine 19. To illustrate, consider that the dolphin will have surfaced directly above the location of the underwater mine 19. Therefore, the pseudoranges for the fix position (i.e., the position at the surface of the water at which point the dolphin surfaced and Snapshot GPS receiver 12 recorded GPS data from the GPS satellites) will be such that they determine a geographic location directly above the underwater mine 19. This location can be marked on a chart so that ships and other vessels can avoid the mine 19. Further, by knowing the depth of the mine 19 (as recorded by depth sensor 18), the precise geographic location of the mine can be determined and demolition crews can be dispatched to deal with it if so desired.

It should be apparent how the above process can be modified where other transportation devices are used. For example, if human divers are used, the divers can mimic the actions of the dolphin by surfacing above the mine to allow a fix to be taken. In such cases, no activation signal need be broadcast by basestation 50 because the diver will recognize when he or she is at the surface and can initiate a fix using a front panel control on positioning sensor 10. Where a remote sled is used, a video camera may be mounted to the sled and images transmitted back to basestation 50. When underwater mine 19 is detected by an operator at basestation 50, the operator can signal for a fix to be taken. Such an embodiment may allow antenna 16 to float on the surface of the water, tethered to the remote sled so that it remains directly above the sled's position. In this way, the sled need not surface when it is time to take a fix because antenna 16 will always have a clear view of the sky. After reviewing this specification, additional variations of the fixing process described above will likely present themselves to persons skilled in the art and the above discussion should be regarded as merely one method of determining the location of a submerged or other remote object according to the present invention.

In addition to the embodiments described above, positioning sensor 10 may also be used to track the movement of the dolphin (or other remote vehicle) itself. That is, in situations where it is the movement of the dolphin which is of interest (e.g., during scientific research, etc.), positioning sensor 10 may be used to relay positioning information back to basestation 50 (assuming positioning sensor 10 is fitted with a modem or other communication device as further discussed below). This embodiment may have other applications, for example, tracking of vehicles, persons or other objects operating in canyons (urban or otherwise) and other areas where only intermittent views of the sky are available is facilitated. Further, positioning sensor 10 may allow for the tracking of spinning or tumbling projectiles (e.g., missiles) where an antenna 16 is fitted on only one side of the projectile and, hence, has only very brief views of the sky as the projectile spins or tumbles about an axis in flight.

One manner in which positioning sensor 10 may be used in such an embodiment is as follows. Positioning sensor 10 is fitted to the object to be tracked, e.g., the dolphin, and is configured to take fixes in the manner described above whenever signal detector 14 receives an appropriate signal. Note that unless depth sensor 18 is providing the functionality of signal detector 14 in this embodiment, its use is optional and will not be required at all where positioning sensor 10 is being used to track objects which are always above the surface of the water.

As the dolphin swims in the water, it surfaces at various times. During each of these surfacing intervals (or during only a predetermined number of these intervals, e.g., every third surfacing), signal detector 14 will detect a fix signal and will notify Snapshot GPS receiver 12 accordingly. At such times, Snapshot GPS receiver 12 will take a fix by storing a predetermined (up to a second or more) amount of GPS data from in-view GPS satellites. This data can be relayed back to basestation 50 to allow for a position determination to be made, or Snapshot GPS receiver 12 may compute pseudoranges as described below and report the pseudoranges to basestation 50 over a communications link. This same procedure may be used where objects other than a dolphin are being tracked.

Figure 3A:
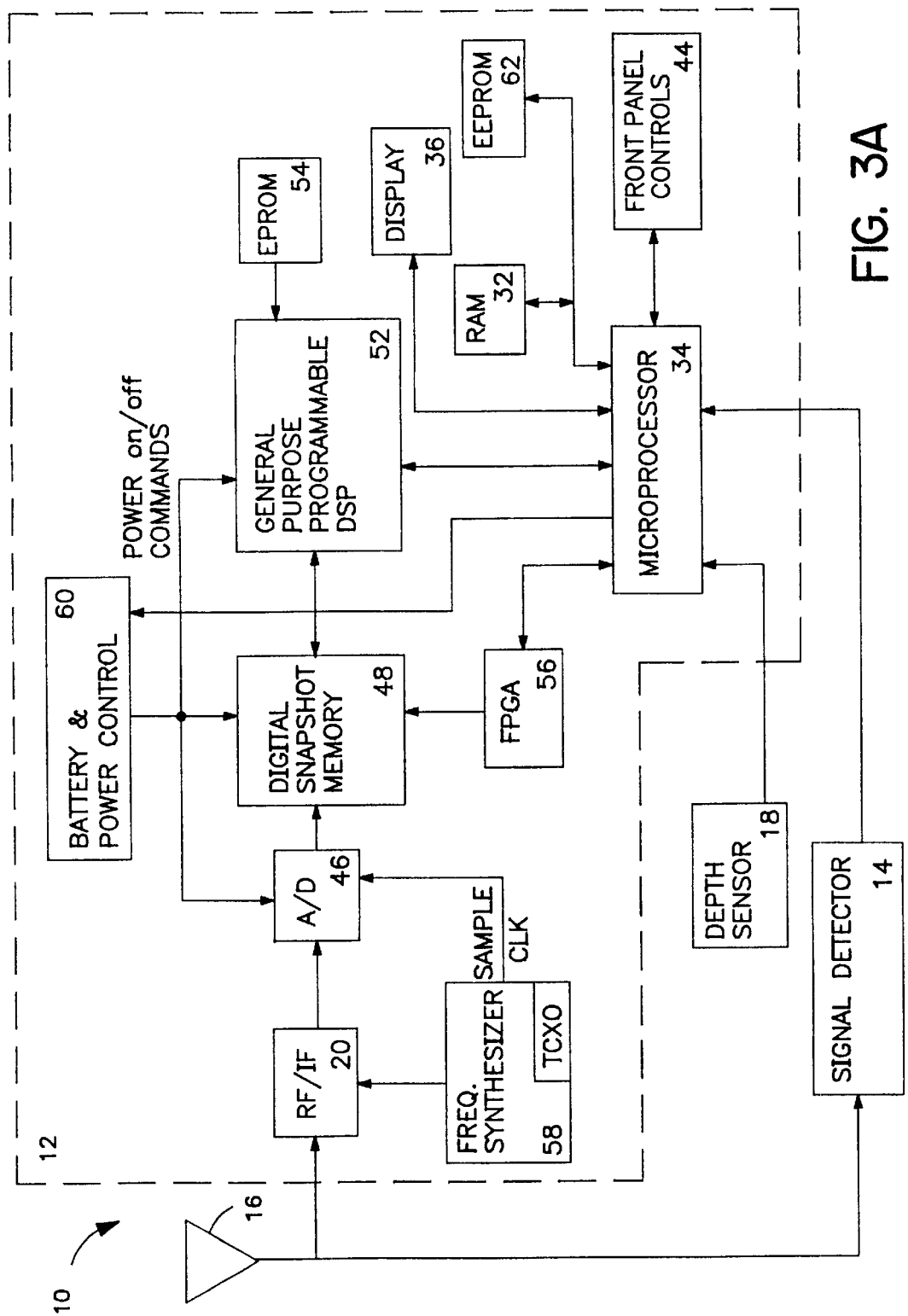
FIG. 3A is a block diagram of the major components of one embodiment of a Snapshot GPS receiver for use with a positioning sensor of the type illustrated in FIG. 1A according to the present invention.

Referring now to FIG. 3A, one embodiment of a Snapshot GPS receiver 12 is shown. Although the remaining discussion will be directed primarily to the embodiments illustrated in FIGS. 3A–3E, it will be apparent to those skilled in the art that the apparatus and methods, including the signal processing functions to be described, may be used in alternative designs. In addition, for embodiments where Snapshot GPS receiver 12 merely stores raw GPS data, the signal processing functions described below may be performed at basestation 50.

Upon detecting an activation signal, signal detector 14 signals microprocessor 34 that it is time to take a fix. Upon receipt of such a signal, microprocessor 34 activates RF to IF downconverter 20, A/D converter 46 and digital snapshot memory 48 via battery and power control circuit 60. This causes signals from GPS satellites, which are received via antenna 16 and downconverted to an IF frequency in RF to IF downconverter 20, to undergo digitization. That is, the IF signals are sampled by A/D converter 46 at a frequency equal to the sample clock generated by frequency synthesizer 58 and the resulting data is stored in digital snapshot memory 48. A contiguous set of such data typically corresponds to a duration of 100 milliseconds to 1 second (or even longer). The addressing of digital snapshot memory 48 is controlled by FPGA 56.

Note that all this time (while the snapshot memory 48 is being filled with the digitized GPS signals from the in view satellites) DSP 52 may be in a low power state. RF/IF downconverter 20 and A/D converter 46 need only be turned on for a short period of time, sufficient to collect and store the data required for pseudorange calculation. After the data collection is complete, these circuits may be turned off, thus not contributing to additional power dissipation during the actual pseudorange calculation. The pseudorange calculation is then performed using, in one embodiment, a general purpose, programmable digital signal processing integrated circuit (DSP) 52, as exemplified by a TMS320C30 integrated circuit from Texas Instruments. DSP 52 is placed in an active power state by the microprocessor 34 via the battery and power control circuit 60 prior to performing such calculations.

This DSP 52 differs from others used in some GPS units in that it is general purpose and programmable, as compared to specialized custom digital signal processing integrated circuits. Furthermore, the DSP 52 makes possible the use of fast convolution algorithms, which permit very rapid computation of the pseudoranges by performing rapidly a large number of convolution operations between a locally generated reference and the received GPS signals. Typically, 2046 such operations are required to complete the search for the epochs of each received GPS signal. The fast convolution algorithms permit a simultaneous and parallel search of all such positions, thus speeding the required computation process by a factor of 10 to 100 over conventional approaches.

Once the DSP 52 has computed the pseudoranges (in the fashion described in detail below), this information may be used to compute the position of positioning sensor 10 for embodiments where satellite ephemeris data has been previously stored in the unit. The manner in which such position computations are performed are well known in the art. The position computations may be performed by microprocessor 34 executing program commands stored in EEPROM 62 or by DSP 52 executing commands stored in EPROM 54. The position computations may be made more accurately using Differential GPS (DGPS) corrections received from basestation 50 or other source of DGPS information (e.g., FM subcarrier broadcasts) during initialization. Alternatively, the calculated pseudorange information may be stored in RAM 32 or another on-board storage device for later processing at basestation 50. In such cases, the pseudorange information will be stored with an appropriate time tag (possibly derived from GPS time as received and computed by Snapshot GPS receiver 12 using methods well known in the art). Such a time tag will allow basestation 50 to determine the time at which the GPS data which was used to compute the pseudoranges was received by Snapshot GPS receiver 12 and will thereby aid in the computation of the geographic location of the fix position at which the GPS data was received.

Figure 3B:
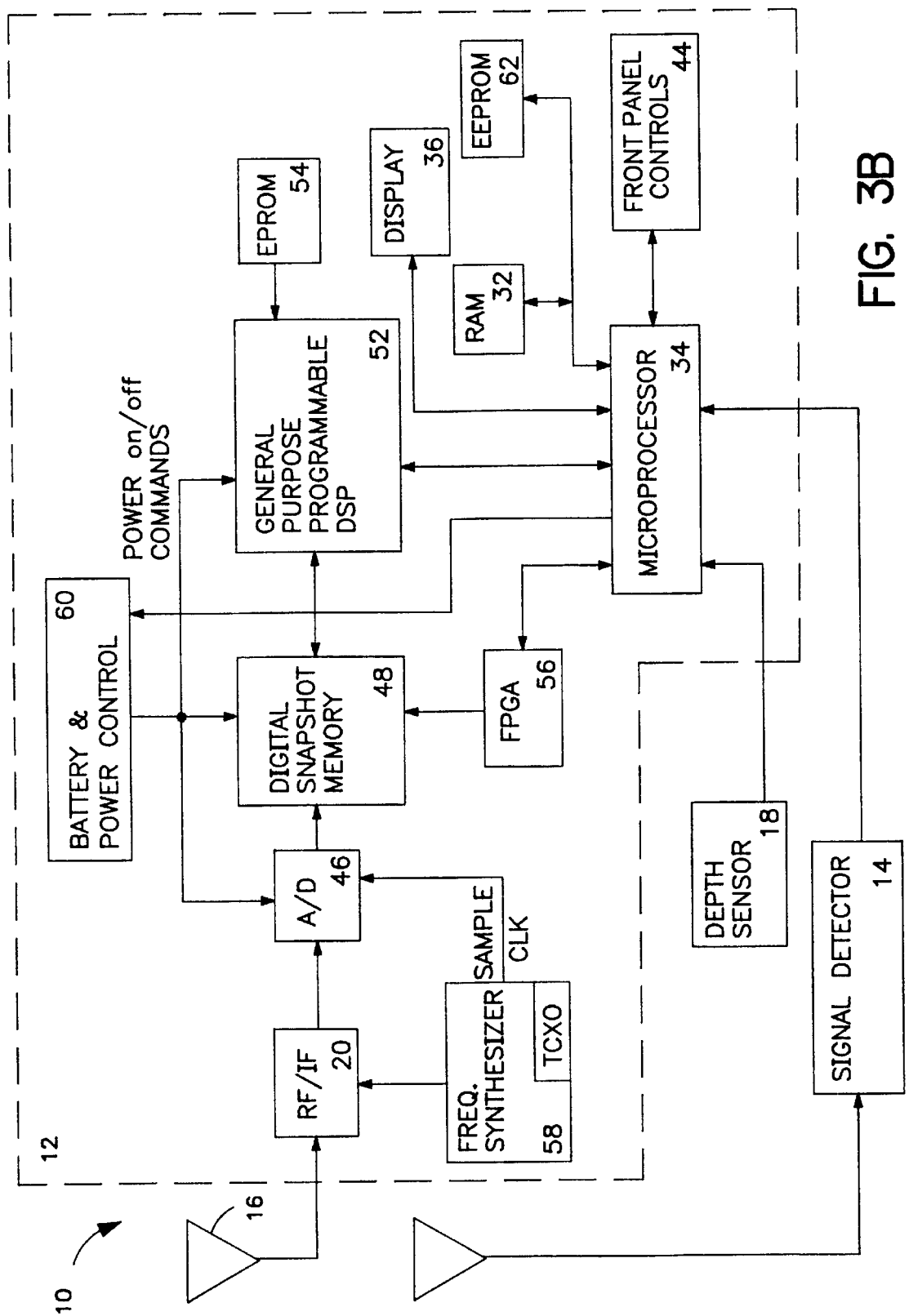
FIG. 3B is a block diagram of the major components of one embodiment of a Snapshot GPS receiver for use with a positioning sensor of the type illustrated in FIG. 1B according to the present invention.
Figure 3C:
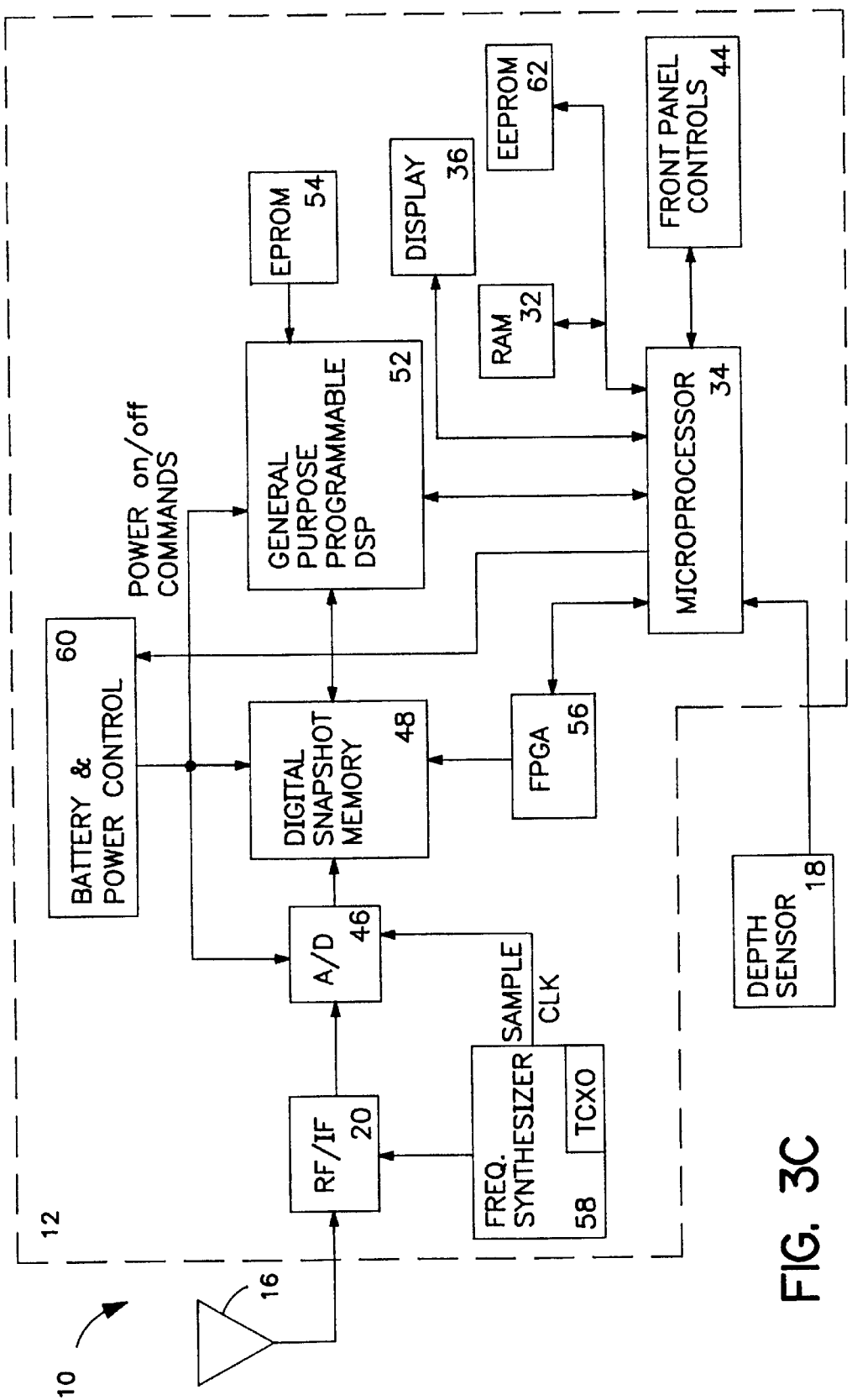
FIG. 3C is a block diagram of the major components of one embodiment of a Snapshot GPS receiver for use with a positioning sensor of the type illustrated in FIG. 1C according to the present invention.
Figure 3D:
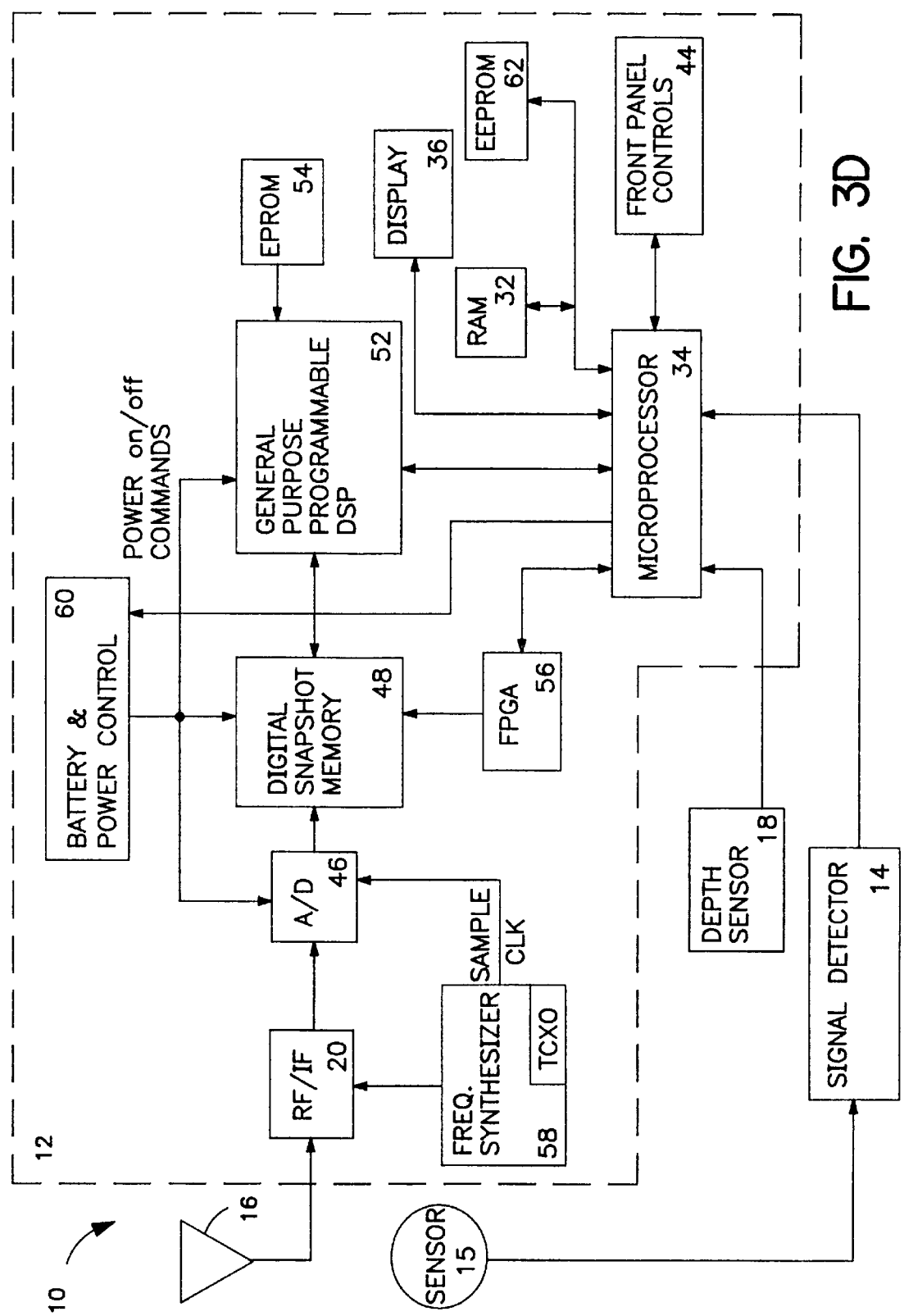
FIG. 3D is a block diagram of the major components of one embodiment of a Snapshot GPS receiver for use with a positioning sensor of the type illustrated in FIG. 1D according to the present invention.
Figure 3E:
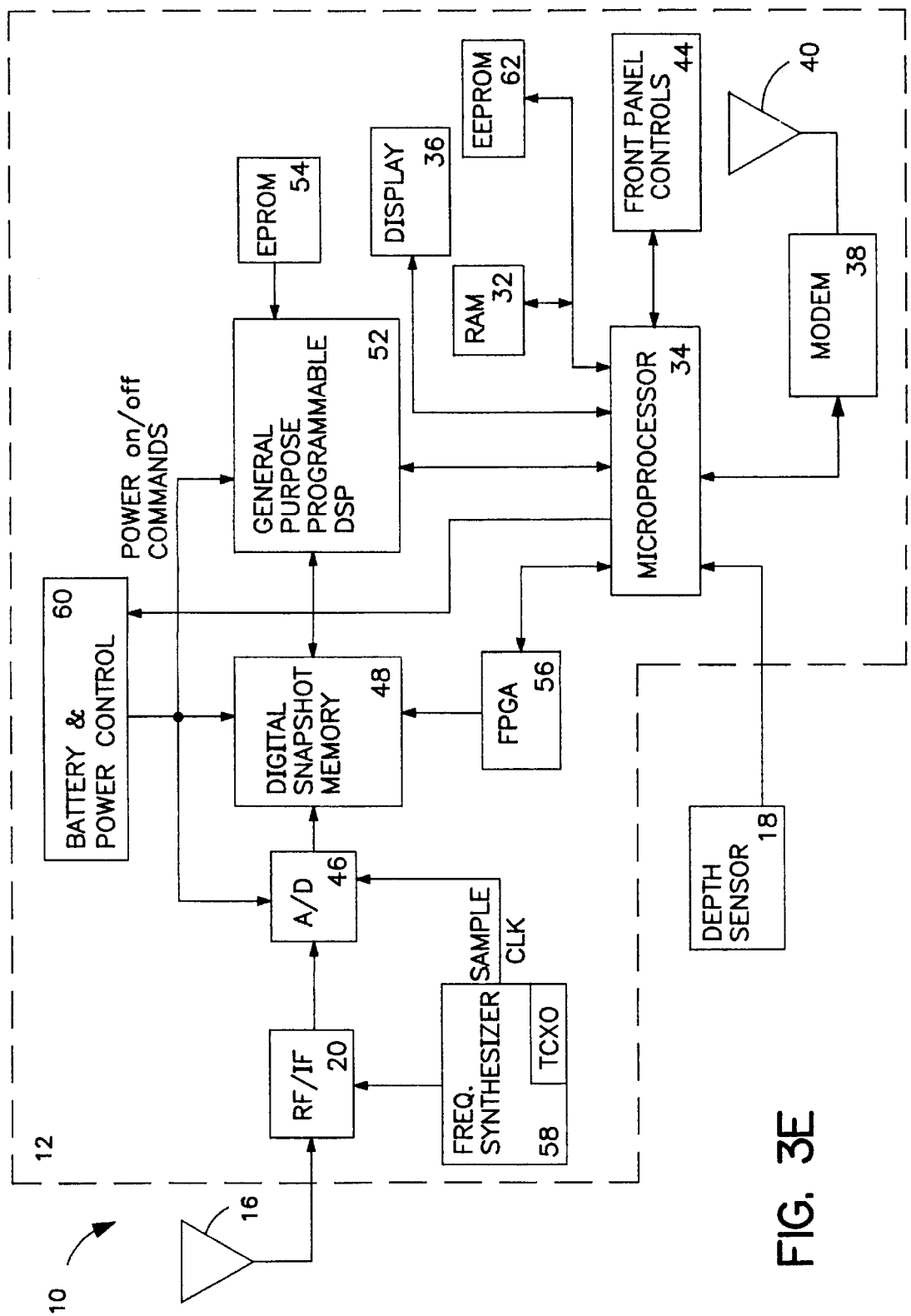
FIG. 3E is a block diagram of the major components of one embodiment of a Snapshot GPS receiver having an internal communication device for use with a positioning sensor of the type illustrated in FIG. 1C according to the present invention.

Alternatively, if positioning sensor 10 is configured with a modem in a fashion similar to the embodiment shown in FIG. 3E, once the DSP 52 completes its computation of pseudoranges for each of the in view satellites, it may transmit this information to basestation 50 across a communication link via modem 38 and under the control of microprocessor 34. At this time the microprocessor 34 may cause the DSP 52 to again enter a low power state by sending an appropriate control signal to the battery and power control circuit 60. In addition to the pseudorange data, a time tag may be simultaneously transmitted to basestation 50. The time tag indicates the elapsed time from the initial data collection in the digital snapshot memory 48 to the time of transmission of the data over the communication link. This time tag improves the capability of the basestation 50 to complete the position calculation because it allows the computation of the GPS satellites' respective positions at the time of data collection. Basestation 50 may utilize differential GPS (DGPS) corrections during this processing to provide more accurate results than would otherwise be possible.

Depth sensor 18 is coupled to microprocessor 34 and provides depth information at periodic intervals. This information may be stored in RAM 32 or other storage device for later use. Depth sensor 18 may operate independently and report the depth information using interrupts or other methods. Alternatively, depth sensor 18 may wait to be polled by microprocessor 34 before reporting depth information. Preferably, depth sensor 18 includes a pressure sensor, however, any device which generates depth information may be used.

Display 36 and front panel controls 44 are optional and may be used during the initialization and downloading processes. Front panel controls 44 may be buttons or other controls and may activate selected modes for Snapshot GPS receiver 12 to store initialization data and/or to download stored pseudorange, depth and/or raw GPS data. Display 36 may be a graphical display on which status and other information may be displayed. Alternatively, display 36 may be a series of LEDs or other indicators.

Figure 1B:
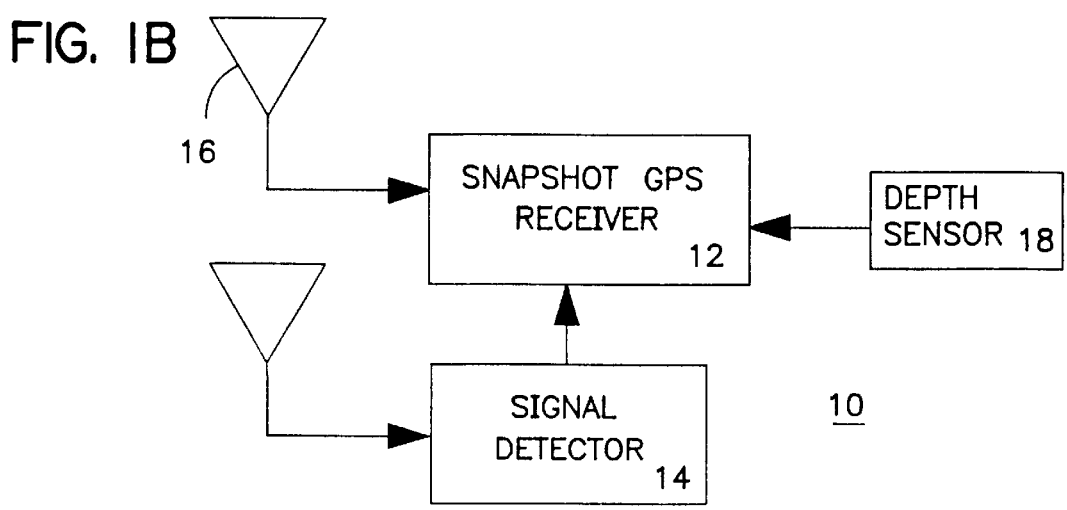
Figure 1C:
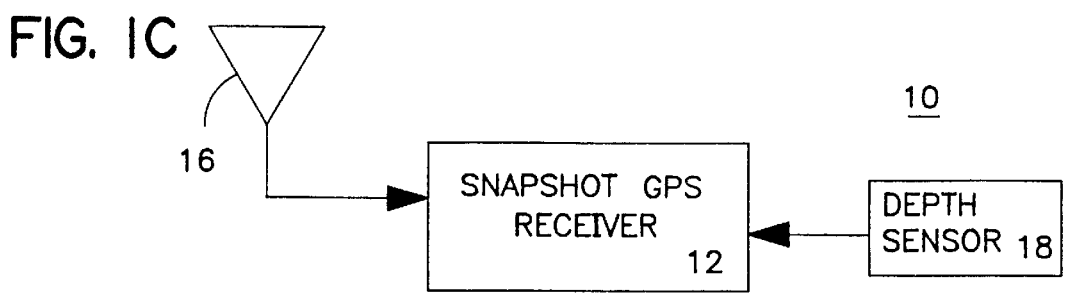
Figure 1D:
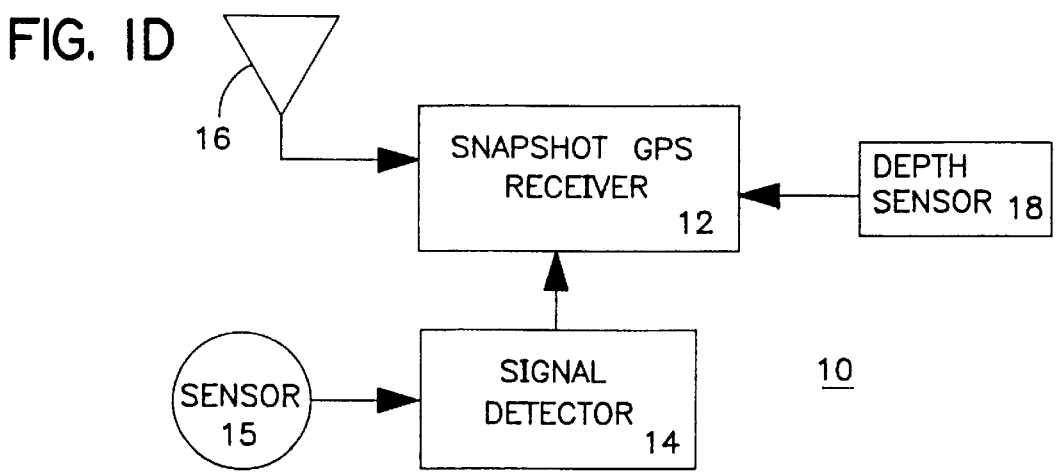

FIG. 3B illustrates a variation of positioning sensor 10 which corresponds to that shown in FIG. 1B. In this embodiment, signal detector 14 has its own antenna.

FIG. 3C illustrates another alternative embodiment. This embodiment corresponds to that shown in FIG. 1C and depth sensor 18 also provides the functionality of signal detector 14 as described above. This embodiment eliminates the need for a separate signal detector and may form a compact unit for easy transport.

FIG. 3D illustrates an embodiment of positioning sensor 12 corresponding to that shown in FIG. 1D. For this embodiment, signal detector 14 is coupled to sensor 15 which responds to non-RF signals as discussed above.

Another alternative embodiment is illustrated in FIG. 3E. This embodiment is similar to the embodiment shown in FIG. 3C and has a modem 38 coupled to microprocessor 34 to provide a means by which positioning sensor 10 can communicate with basestation 50 over a data or other communication link. Of course, modem 38 represents only one possible communication device suitable for this purpose and other communication devices could also be used. In addition, any of the other embodiments illustrated in FIGS. 3A, 3B and 3D could incorporate such a modem 38.

For the embodiment shown in FIG. 3E, modem 38 utilizes a separate communication antenna 40 to transmit and receive messages over a communication link. In other embodiments, modem 38 may utilize antenna 16, however, it will be appreciated that one limitation of such an embodiment will be that while modem 38 is transmitting, GPS data cannot be received unless extremely good filtering is used to isolate such transmissions from the sensitive GPS receiving sections. Modem 38 includes a communications receiver and a communications transmitter which are alternatively coupled to antenna 40 as required.

Where a communication link is used, Snapshot GPS receiver 12 may employ an automatic frequency control (AFC) loop to lock to this carrier and thereby further calibrate its own reference oscillator. A message transmission time of 10 msec, with a received signal to noise ratio of 20 dB, will normally allow frequency measurement via an AFC to an accuracy of 10 Hz or better. This will typically be more than adequate for the requirements of the present invention.

In one embodiment, the communication link may be a commercially available narrow bandwidth radio frequency communications medium, such as a two-way pager system. This system may be used in embodiments where the amount of data to be transmitted between the basestation 50 and the Snapshot GPS receiver 12 is relatively small. In other embodiments, where the amount of data to be transferred between basestation 50 and Snapshot GPS receiver 12 is relatively large, a higher bandwidth communication link will be required.

Figure 3F:
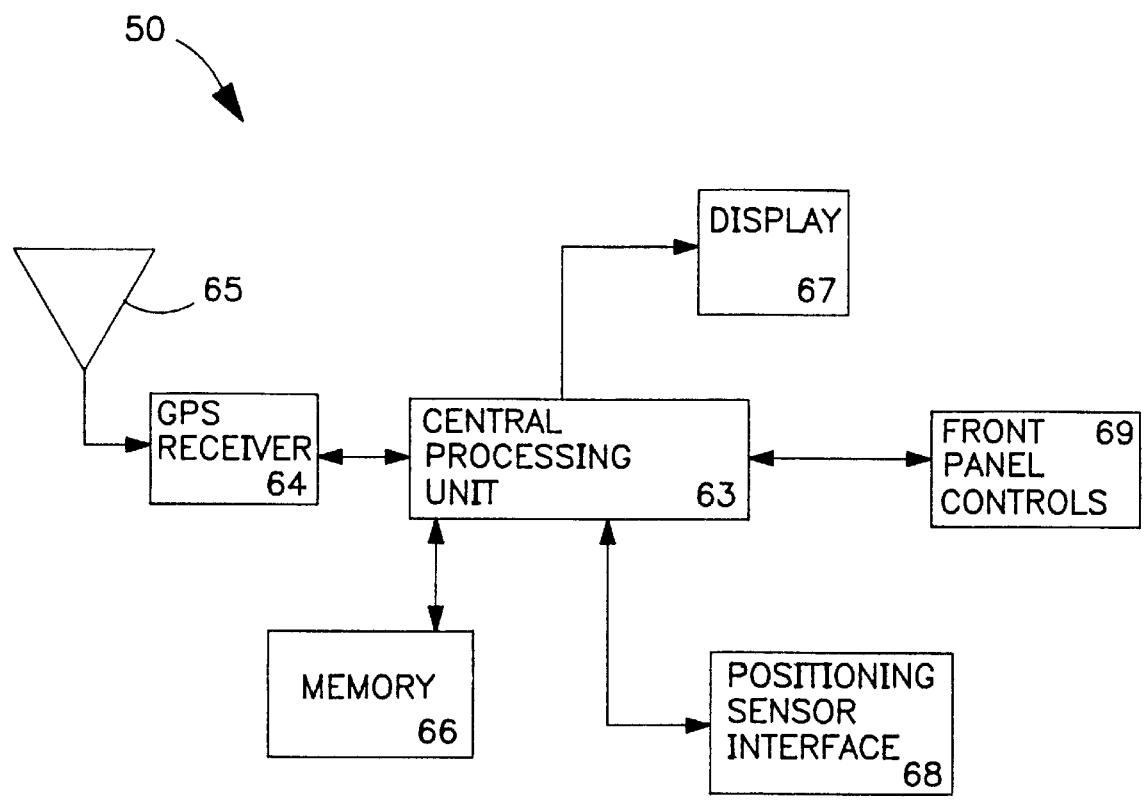
FIG. 3F is a block diagram illustrating the major components of a basestation configured according to the present invention.

One embodiment for basestation 50 is illustrated in FIG. 3F. Basestation 50 includes central processing unit 63 which operates to compute geographic locations based on pseudo-range or raw GPS data provided by positioning sensor 10. The manner in which such computations are performed is well known in the art. Basestation 50 also includes GPS receiver 64 with its associated antenna 65. GPS receiver 64 is a conventional GPS receiver and provides central processing unit 63 with GPS data to allow for the required computations. Where the location of basestation 50 is known, positions derived from GPS receiver 64 may serve to provide a basis for central processing unit 63 to compute differential GPS (DGPS) corrections for later use. Alternatively, basestation 50 may obtain such corrections from commercially available sources such as local Coast Guard broadcast centers or other sources.

Basestation 50 also includes memory 66 which will typically store the operating code for central processing unit 63. Where basestation 50 performs the signal processing functions described below, memory 66 may store those instructions as well. In addition, once basestation 50 has computed the location of underwater mine 19 based on information from positioning sensor 10, basestation 50 may generate a map or other display showing the location of the mine. To accommodate such activities, memory 66 may contain digital map data, for example in the form of a GIS database. A resulting map could be displayed on display 67 and/or printed out for later reference.

Positioning sensor interface 68 may take any of a number of forms. Where positioning sensor 10 includes a modem or other communication device, it will include an appropriate communication device to relay information between positioning sensor 10 and central processing unit 63. In other embodiments, positioning sensor interface 68 may be an RS-232 or other digital connection which allows for initialization, pseudorange and other information to be exchanged between positioning sensor 10 and central processing unit 63.

Front panel controls 69 may be provided to allow a user interface with central processing unit 63. Front panel controls 69 may include a keyboard, a mouse, and/or an infra-red or other remote control.

As indicated above, the digital snapshot memory 48 captures a record length of data corresponding to a relatively long period of time. The efficient processing of this large block of data using fast convolution methods contributes to the ability of the present invention to process signals at low received levels (e.g., when reception is poor due to partial blockage from buildings, trees, etc.). All pseudoranges for visible GPS satellites are computed using this same buffered data. This provides improved performance relative to continuous tracking (i.e., conventional) GPS receivers in situations in which the signal amplitude is rapidly changing or there is very brief view of the sky.

Figure 4A:
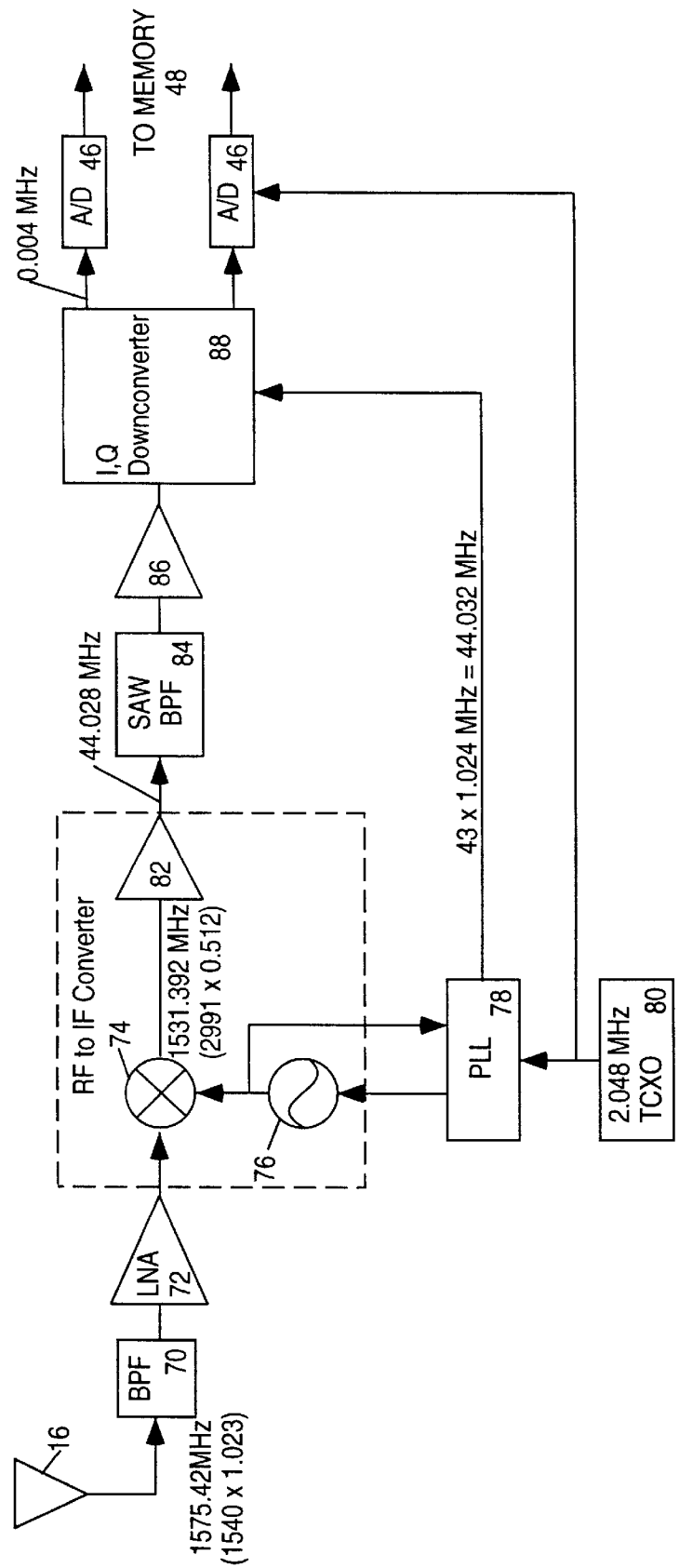
FIG. 4A is a block diagram illustrating one embodiment of the RF and IF portions of a Snapshot GPS receiver for use according to the present invention.

A representative example of an RF to IF downconverter 20 and digitizing system for the Snapshot GPS receiver 12 is shown in FIG. 4A. The input signal from antenna 16 at 1575.42 MHz is passed through a bandlimiting filter (BPF) 70 and low noise amplifier (LNA) 72 and sent to a frequency conversion stage. The local oscillator (LO) 76 used in this stage is phase locked (via PLL 78) to a 2.048 MHz (or harmonic thereof) temperature compensated crystal oscillator (TCXO) 80. In a preferred implementation, the LO frequency would be 1531.392 MHz, which is 2991×0.512 MHz. The resulting IF signal is then centered at 44.028 MHz. This IF is desirable due to the availability of low cost components near 44 MHz. In particular, surface acoustic wave (SAW) filters, which are utilized in abundance in television applications, are readily available. Of course, other bandlimiting devices could be used instead of SAW devices.

The received GPS signal is mixed with the LO signal in mixer 74 to produce the IF signal. This IF signal is passed through a SAW filter 84, for precision bandlimiting to 2 MHz bandwidth, and then sent to an I/Q down-converter 88, which translates the signal to near baseband (4 kHz center frequency nominally). The local oscillator frequency for this downconverter 88 is derived from the 2.048 MHz TCXO 80 as the 43rd harmonic of 1.024 MHz, that is 44.032 MHz.

The I/Q downconverter 88 is generally commercially available as an RF component. It typically consists of two mixers and lowpass filters. In such instances, the input ports of one mixer are fed with the IF signal and the LO signal and the input ports to the other mixer are fed with the same IF signal and the LO signal phase shifted by 90°. The outputs of the two mixers are lowpass filtered to remove feedthrough and other distortion products.

As shown in FIG. 4A, amplifiers 82 and 86 may be used before and after the bandlimiting operation as required.

The two outputs of the I/Q downconverter 88 are sent to two matched A/D converters 46 which sample the signals at 2.048 MHz. An alternative implementation replaces the A/D converters 46 with comparators (not shown), each of which outputs a two-valued (one-bit) sequence of data in accordance with the polarity of the incoming signal. It is well known that this approach results in a loss of approximately 1.96 dB in receiver sensitivity relative to a multilevel A/D converter. However, there may be substantial cost savings in use of a comparator vs. A/D converters, as well as in the reduced memory requirement in the following digital snapshot memory 48.

Figure 4B:
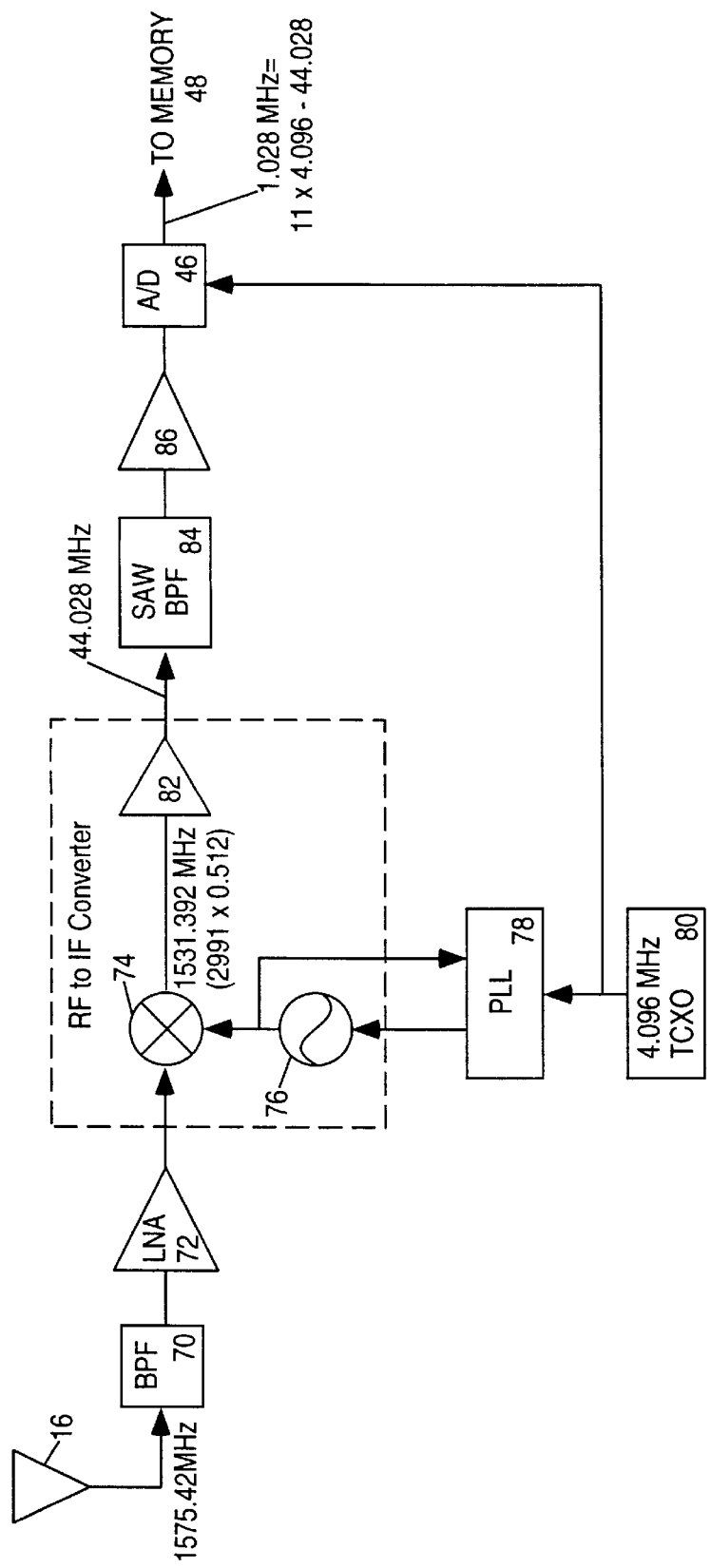
FIG. 4B is a block diagram illustrating an alternative embodiment of the RF and IF portions of a Snapshot GPS receiver for use according to the present invention.

An alternative implementation of the RF to IF downconverter and digitizing system is shown in FIG. 4B which utilizes a bandpass sampling method. The TCXO 80 employed is at frequency 4.096 MHz (or an harmonic thereof). The TCXO 80 output may be used as the sample clock to the A/D converter 46 (or comparator); this acts to translate the signal to 1.028 MHz. This frequency is the difference between the 11th harmonic of 4.096 MHz and the input IF frequency 44.028 MHz. The resulting 1.028 MHz IF is nearly one-fourth the sample rate, which is known to be nearly ideal in minimizing sampling type distortions. As compared to the I/Q sampling of FIG. 4A, this single sampler provides one channel of data rather than two, but at twice the rate. In addition, the data is effectively at an IF of 1.028 MHz. I/Q frequency conversion to near 0 MHz would then be implemented by digital means in the following processing to be described. The apparatus of FIGS. 4A and 4B are competitive in cost and complexity; often component availability dictates the preferred approach. It will be apparent to those skilled in the art, however, that other receiver configurations could be used to achieve similar results.

In order to simplify the following discussion, the following assumes that the I/Q sampling of FIG. 4A is employed and that the digital snapshot memory 48 contains two channels of digitized data at 2.048 MHz.

Figure 5:
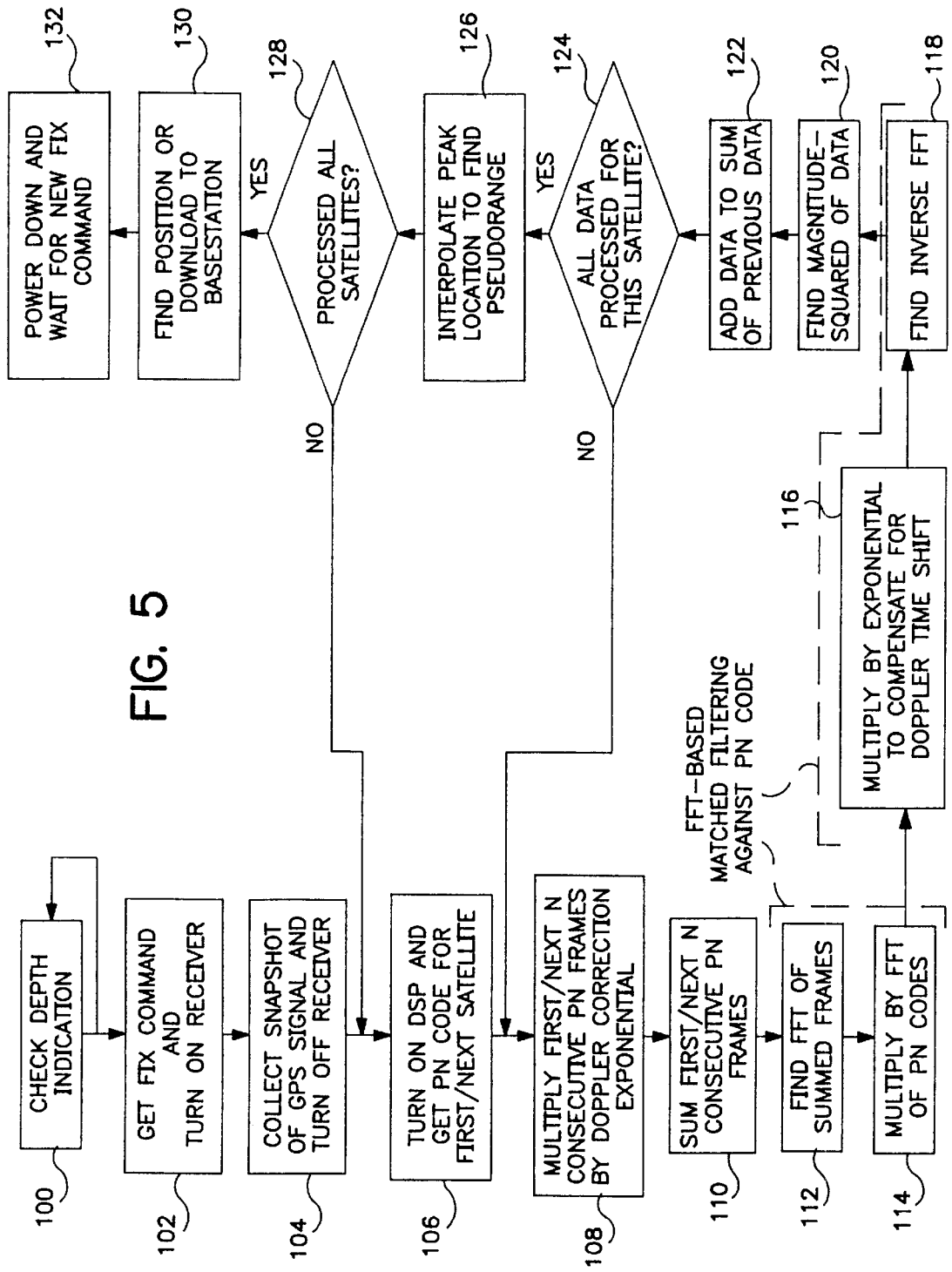
FIG. 5 shows a flowgraph of the major software operations performed by a programmable DSP processor for use in a Snapshot GPS receiver or basestation in accordance with the present invention.

Details of the signal processing performed in the DSP 52 may be understood with the aid of the flowgraph of FIG. 5 and the pictorial of FIGS. 6A–6E. It will be apparent to those skilled in the art that the machine code, or other suitable code, for performing the signal processing to be described may be stored in EPROM 54. Other non-volatile storage devices could also be used. For embodiments where this processing is done at basestation 50, suitable storage means (e.g., memory 66) will store the appropriate code. The objective of the processing is to determine the timing of the received waveform with respect to a locally generated waveform. Furthermore, in order to achieve high sensitivity, a very long portion of such a waveform, typically 100 milliseconds to 1 second, is processed.

Figure 6A:
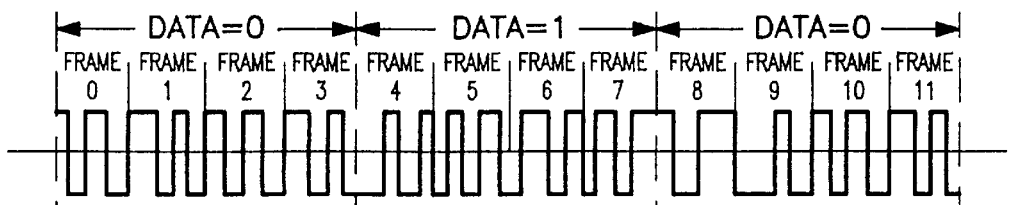
FIGS. 6A–6E illustrate signal processing waveforms at various stages of processing in a Snapshot GPS receiver or basestation according to the present invention.

In order to understand the processing, one first notes that each received GPS signal (C/A mode) is constructed from a high rate (1 MHz) repetitive pseudorandom (PN) pattern of 1023 symbols, commonly called "chips." These "chips" resemble the waveform shown in FIG. 6A. Further imposed on this pattern is low rate data, transmitted from the satellite at 50 baud. All of this data is received at a very low signal-to-noise ratio as measured in a 2 MHz bandwidth. If the carrier frequency and all data rates were known to great precision, and no data were present, then the signal-to-noise ratio could be greatly improved, and the data greatly reduced, by adding to one another successive frames. For example, there are 1000 PN frames over a period of 1 second. The first such frame could be coherently added to the next frame, the result added to the third frame, etc. The result would be a signal having a duration of 1023 chips. The phasing of this sequence could then be compared to a local reference sequence to determine the relative timing between the two, thus establishing the so-called pseudorange.

The above process must be carried out separately for each satellite in view from the same set of stored received data in the digital snapshot memory 48, since, in general, the GPS signals from different satellites have different Doppler frequencies and the PN patterns differ from one another.

The above process is made difficult by the fact that the carrier frequency may be unknown by in excess of 5 kHz due to signal Doppler uncertainty and by an additional amount due to receiver local oscillator uncertainty. These Doppler uncertainties are removed in one embodiment of the present invention by storing satellite ephemeris information in RAM 32 before positioning sensor 10 enters the operating area. This ephemeris information is typically valid for one to two hours and will allow Snapshot GPS receiver 12 to compute the expected Dopplers for the in-view satellites. These computations may be performed by microprocessor 34 or DSP 52 under the control of appropriate program instructions stored in EEPROM 62 or EPROM 54. Of course, the calculated Doppler information for in-view satellites (rather than all of the ephemeris data) could be stored during the initialization process. Alternatively, for embodiments utilizing the communications link discussed above, Doppler information could be transmitted from basestation 50 to Snapshot GPS receiver 12 while positioning sensor 10 is in the operating environment. Basestation 50 would therefore require a GPS receiver 64 which monitors all GPS signals from in-view satellites, and would transmit the Doppler information in response to a signal via the communications link indicating that positioning sensor 10 had entered the snapshot mode. Using any of these methods, Doppler search is avoided at the positioning sensor 10, thus speeding the pseudorange determination. The local oscillator uncertainty can also be greatly reduced (to perhaps 50 Hz) by the aforementioned AFC operation performed using the communication link signal.

The presence of 50 baud data superimposed on the GPS signal still limits the coherent summation of PN frames beyond a period of 20 msec. That is, at most 20 frames may be coherently added before data sign inversions prevent further processing gain. Additional processing gain may be achieved through matched filtering and summation of the magnitudes (or squares of magnitudes) of the frames, as detailed in the following paragraphs.

The flowgraph of FIG. 5 begins at step 100 where microprocessor 34 analyzes information from depth sensor 18 to calculate a current depth for positioning sensor 10. The maximum such depth may be stored within RAM 32 for later use, as such a depth may represent the depth of the submerged object of interest. For the embodiment of FIGS. 1C and 3C, when the depth information indicates that positioning sensor 10 is at or near the surface, this will be used as an indication to take a fix. For other embodiments, an activation or fix signal will be recognized by signal detector 14 at step 102 and used to initiate a snapshot GPS processing operation. Where necessary (e.g., where no prior Doppler or ephemeris information has been stored in Snapshot GPS receiver 12), this step includes a transmission from positioning sensor 10 to basestation 50 for Doppler information for the in-view satellites to be transmitted from basestation 50 over a communication link. In addition, and where necessary, at step 102 the Snapshot GPS receiver 12 computes its local oscillator drift, for example, by frequency locking to the signal transmitted from the basestation 50. An alternative would be to utilize a very good quality temperature compensated crystal oscillator (TCXO 80) in the unit. For example, digitally controlled TCXOs, so-called DCXOs, currently can achieve accuracy of about 0.1 parts per million, or an error of about 150 Hz for the L1 GPS signal. Further, at step 102 microprocessor 34 turns on power to RF/IF downconverter 20, A/D converters 46 and digital snapshot memory 48 in preparation to take a fix.

At step 104, a snapshot of data of duration K PN frames of the C/A code, where K is typically 100 to 1000 (corresponding to 100 msec to 1 second time duration) is collected. When a sufficient amount of data has been collected, microprocessor 34 turns off the RF/IF downconverter 20 and A/D converters 46. For embodiments where only raw GPS data is to be collected, this will complete the fix operation, and the processing described below will occur at basestation 50. However, in the remaining discussion, it is assumed that pseudorange calculation is performed at positioning sensor 10.

The pseudorange of each satellite is computed in turn as follows. First, at step 106 for the given GPS satellite signal to be processed, the corresponding pseudorandom code (PN) is retrieved from EPROM 54. As discussed shortly, the preferred PN storage format is actually the Fourier transform of this PN code, sampled at a rate of 2048 samples per the 1023 PN bits.

The data in digital snapshot memory 48 is processed in blocks of N consecutive PN frames, that is blocks of 2048N complex samples (N is an integer typically in the range 5 to 10). Similar operations are performed on each block as shown in the bottom loop (steps 108–124) of FIG. 5. That is, this loop is performed a total of K/N times for each GPS signal to be processed.

At step 108 the 2048N data words of the block are multiplied by a complex exponential that removes the effects of Doppler on the signal carrier, as well as the effects of drifting of the receiver local oscillator. To illustrate, suppose the Doppler frequency obtained from the previously stored ephemeris information or the basestation 50 plus local oscillator offsets corresponded to $f_e$ Hz. Then the premultiplication of the data would take the form of the function $e^{-j2\pi f_e nT}$, n=[0, 1, 2, . . . , 2048N−1]+(B−1)×2048N, where T=1/2.048 MHz is the sampling period, and the block number B ranges from 1 to K/N.

Figure 6B:
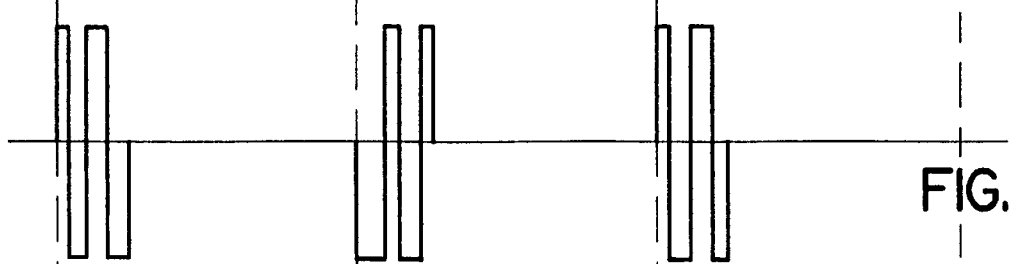

Next, at step 110, the adjacent groups of N (typically 10) frames of data within the block are coherently added to one another. That is, samples 0, 2048, 4096, . . . 2048(N−1) −1 are added together, then 1, 2049, 4097, . . . 2048(N−1) are added together, etc. At this point the block contains only 2048 complex samples. An example of the waveform produced by such a summing operation is illustrated in FIG. 6B for the case of 4 PN frames. This summing operation may be considered a preprocessing operation which precedes the fast convolution operations.

Next, at steps 112–118, each of the averaged frames undergoes a matched filtering operation, which purpose is to determine the relative timing between the received PN code contained within the block of data and a locally generated PN reference signal. Simultaneously, the effects of Doppler on the sampling times is also compensated for. These operations are greatly speeded, in one embodiment, by the use of fast convolution operations such as Fast Fourier Transform (FFT) algorithms used in a manner to perform circular convolution, as presently described.

In order to simplify discussion, the above mentioned Doppler compensation is initially neglected.

The basic operation to be performed is a comparison of the data in the block being processed (2048 complex samples) to a similar reference PN block stored locally. The comparison is actually done by (complex) multiplying each element of the data block by the corresponding element of the reference and summing the results. This comparison is termed a "correlation." However, an individual correlation is only done for one particular starting time of the data block, whereas there are 2048 possible positions that might provide a better match. The set of all correlation operations for all possible starting positions is termed a "matched filtering" operation. The full matched filtering operation is required in a preferred embodiment.

The other times of the PN block can be tested by circularly shifting the PN reference and reperforming the same operation. That is, if the PN code is denoted p(0) p(1) . . . p(2047), then a circular shift by one sample is p(1) p(2) . . . p(2047) p(0). This modified sequence tests to determine if the data block contains a PN signal beginning with sample p(1). Similarly the data block may begin with samples p(2), p(3), etc., and each may be tested by circularly shifting the reference PN and reperforming the tests. It should be apparent that a complete set of tests would require 2048×2048= 4,194,304 operations, each requiring a complex multiplication and addition.

Figure 6C:
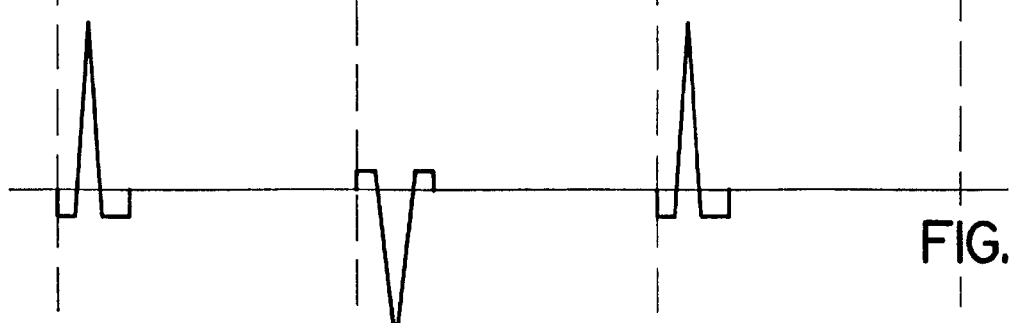

A more efficient, mathematically equivalent method may be employed, utilizing the Fast Fourier Transform (FFT), which only requires approximately 12×2048 complex multiplications and twice the number of additions. In this method, the FFT is taken for the data block, at step 112, and for the PN block. The FFT of the data block is multiplied by the complex conjugate of the FFT of the reference, at step 114, and the results are inverse Fourier transformed at step 118. The resulting data so gotten is of length 2048 and contains the set of correlations of the data block and the PN block for all possible positions. Each forward or inverse FFT operation requires P/2 log$_2$ P operations, where P is the size of the data being transformed (assuming a radix-2 FFT algorithm is employed). For the case of interest, P=2048, so that each FFT requires 11×1024 complex multiplications. However, if the FFT of the PN sequence is prestored in EPROM 54, as in a preferred embodiment, then its FFT need not be computed during the filtering process. The total number of complex multiplies for the forward FFT, inverse FFT and the product of the FFFs is thus (2×11+2)×1024= 24576, which is a savings of a factor of 171 over direct correlation. FIG. 6C illustrates the waveform produced by this matched filtering operation.

The preferred method of the current invention utilizes a sample rate such that 2048 samples of data were taken over the PN period of 1023 chips. This allows the use of FFT algorithms of length 2048. It is known that FFT algorithms that are a power of 2, or 4, are normally much more efficient than those of other sizes (and 2048=$2^{11}$). Hence the sampling rate so chosen significantly improves the processing speed. It is preferable that the number of samples of the FFT equal the number of samples for one PN frame so that proper circular convolution may be achieved. That is, this condition allows the test of the data block against all circularly shifted versions of the PN code, as discussed above. A set of alternative methods, known in the art as "overlap save" or "overlap add" convolution may be utilized if the FFT size is chosen to span a number of samples different from that of one PN frame length. These approaches require approximately twice the number of computations as described above for the preferred implementation.

It should be apparent to one skilled in the art how the above process may be modified by utilizing a variety of FFT algorithms of varying sizes together with a variety of sample rates to provide fast convolution operations. In addition, a set of fast convolution algorithms exist which also have the property that the number of computations required are proportional to $P \log^2 P$ rather than $P_2$ as is required in straightforward correlation. Many of these algorithms are enumerated in standard references, for example, H. J. Nussbaumer, "Fast Fourier Transform and Convolution Algorithms," New York, Springer-Verlag, C1982. Important examples of such algorithms are the Agarwal-Cooley algorithm, the split nesting algorithm, recursive polynomial nesting algorithm, and the Winograd-Fourier algorithm, the first three of which are used to perform convolution and the latter used to perform a Fourier transform. These algorithms may be employed in substitution of the preferred method presented above.

The method of time Doppler compensation employed at step 116 is now explained. In the preferred implementation, the sample rate utilized may not correspond exactly to 2048 samples per PN frame due to Doppler effects on the received GPS signal as well as local oscillator instabilities. For example, it is known that the Doppler shift can contribute a delay error of ±2700 nsec/sec. In order to compensate for this effect, the blocks of data processed in the above description need to be time shifted to compensate for this error. As an example, if the block size processed corresponds to 5 PN frames (5 msec), then the time shift from one block to another could be as much as ±13.5 nsec. Smaller time shifts result from local oscillator instability. These shifts may be compensated for by time shifting the successive blocks of data by multiples of the time shift required by a single block. That is, if the Doppler time shift per block is d, then the blocks are time shifted by nd, where n=0, 1, 2, . . . .

In general these time shifts are fractions of a sample. Performing these operations directly using digital signal processing methods involves the use of nonintegral signal interpolation methods and results in a high computation burden. An alternative approach, that is a preferred method of the present invention, is to incorporate the processing within the fast Fourier transform functions. It is well-known that a time shift of d seconds is equivalent to multiplying the Fourier Transform of a function by $e^{-2Icfd}$, where f is the frequency variable. Thus, the time shift may be accomplished by multiplying the FFT of the data block by $e^{-j2\pi nd/T_f}$ for n=0, 1, 2, . . . , 1023 and by $e^{-j2\pi(n-2048)d/T_f}$ for n=1024, 1025, . . . , 2047, where $T_f$ is the PN frame duration (1 millisecond). This compensation adds only about 8% to the processing time associated with the FFT processing. The compensation is broken into two halves in order to guarantee continuity of phase compensation across 0 Hz.

Figure 6D:
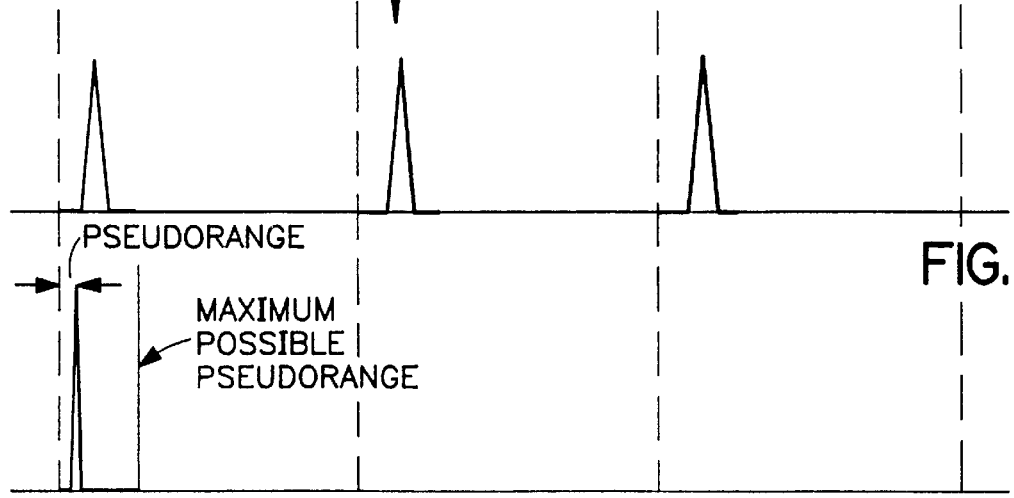
Figure 6E:

After the matched filtering operation is complete, the magnitudes, or magnitudes-squared, of the complex numbers of the block are computed at step 120. Either choice will work nearly as well. This operation removes effects of 50 Hz data phase reversals (as shown in FIG. 6D) and low frequency carrier errors that remain. The block of 2048 samples is then added to the sum of the previous blocks processed at step 122. Step 122 may be considered a post processing operation which follows the fast convolution operation provided by steps 122–188. This continues until all K/N blocks are processed, as shown by the decision block at step 124, at which time there remains one block of 2048 samples, from which a pseudorange is calculated. FIG. 6E illustrates the resulting waveform after the summing operation.

Pseudorange determination occurs at step 126. A peak is searched for above a locally computed noise level. If such a peak is found, its time of occurrence relative to the beginning of the block represents the pseudorange associated with the particular PN code and the associated GPS satellite.

An interpolation routine is utilized at step 126 to find the location of the peak to an accuracy much greater than that associated with the sample rate (2.048 MHz). The interpolation routine depends upon the prior bandpass filtering used in the RF/IF portion of the Snapshot GPS receiver 12. A good quality filter will result in a peak having a nearly triangular shape with the width of the base equal to 4 samples. Under this condition, following subtraction of an average amplitude (to remove a DC baseline), the largest two amplitudes may be used to determine the peak position more precisely. Suppose these amplitudes are denoted Ap and $A_{p+1}$, where $A_p > A_{p+1}$, without loss of generality, and p is the index of the peak amplitude. Then the position of the peak relative to that corresponding to $A_p$ may be provided by the formula: peak location=$p+A_p/t(A_p+A_{p+1})$.

For example if $A_p=A_{p+1}$, then the peak location is found to be p+0.5, that is, halfway between the indices of the two samples. In some situations the bandpass filtering may round the peak and a three point polynomial interpolation may be more suitable.

In the preceding processing, a local noise reference used in thresholding may be computed by averaging all the data in the final averaged block, after removing the several largest such peaks.

Once the pseudorange is found, the processing continues at step 128 in a similar manner for the next satellite in view, unless all such satellites have been processed. Upon completion of the processing for all such satellites, the process continues at step 130 where the pseudorange data is either stored in RAM 32 for later downloading and processing or is transmitted to the basestation 50 over a communication link, where the final position calculation of the positioning senaor 10 and underwater mine 19 is performed. Alternatively, the position calculations may be performed at positioning sensor 10 using previously stored satellite ephemeris data from RAM 32. The computed position may be stored in RAM 32 for later processing and/or transmitted to basestation 50 over the communication link. Finally, at step 132, the majority of the Snapshot GPS receiver circuitry of the positioning sensor 10 is placed in a low power state, awaiting a new command to perform another positioning operation.

Positioning sensor 10 can continue to operate in this fashion, computing pseudoranges and/or positions periodically as submerged objects are discovered, until an entire area of interest (e.g., a harbor approach or other area) has been explored. In the foregoing embodiment, the processing of GPS signals from each satellite while in the snapshot mode occurs sequentially in time, rather than in parallel. In an alternative embodiment, the GPS signals from all in-view satellites may be processed together in a parallel fashion in time.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PRN code (similar to a GPS signal) modulated on an L-band carrier signal, generally synchronized with GPS time. Each transmitter may be assigned a unique PRN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

It will be further appreciated that the methods and apparatus of the present invention are equally applicable for use with the GLONASS and other satellite-based positioning systems. The GLONASS system differs from the GPS system in that the emissions from different satellites are differentiated from one another by utilizing slightly different carrier frequencies, rather than utilizing different pseudo-random codes. In this situation, substantially all the circuitry and algorithms described above are applicable, with the exception that when processing a new satellite's emission, a different complex exponential multiplier is used to preprocess the data. The operation may be combined with the Doppler correction operation of step 108 of FIG. 5, without requiring any additional processing operations. Only one PN code is required in this situation, thus eliminating the need to obtain multiple such codes at step 106.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of operating a global positioning system (GPS) receiver, comprising:

sensing whether GPS signals are capable of being received from GPS satellites and providing an activation signal when GPS signals are capable of being received;

maintaining said GPS receiver in a low power state; and activating said GPS receiver from said low power state upon detecting said activation signal.

2. A method of operating a GPS receiver as in claim 1 wherein said activation signal is generated from a receipt of a transmission by a basestation remote from said GPS receiver.

3. A method of operating a GPS receiver as in claim 1 wherein said activation signal is generated from a receipt of a signal transmitted by a GPS satellite.

4. A method of operating a GPS receiver as in claim 1 wherein said activating comprises:

downconverting a received GPS signal from a GPS satellite to an intermediate signal;

digitizing said intermediate signal to produce a sampled signal; and storing a predetermined record length of said sampled signal in a computer readable medium.

5. A method of operating a GPS receiver as in claim 4 further comprising returning said GPS receiver to said low power state after said activating.

6. A method of operating a GPS receiver as in claim 4 wherein said activating further comprises computing a pseudorange from said GPS satellite to said positioning sensor using said stored sampled signal.

7. A method of operating a GPS receiver as in claim 6 wherein said activating further comprises transmitting said pseudorange from said GPS receiver to a base station.

8. A method of operating a GPS receiver as in claim 7 further comprising returning said GPS receiver to a low power state after said activating.

9. A method of operating a GPS receiver as in claim 4 wherein said activation signal is generated from a receipt of a transmission by a basestation remote from said GPS receiver.

10. A method of operating a GPS receiver as in claim 4 wherein said activation signal is generated from a receipt of a signal transmitted by a GPS satellite.

11. A method as in claim 1 wherein a processor in said GPS receiver is maintained in a low power state while GPS signals are received and stored in a digital buffer.

12. A method as in claim 11 wherein said GPS signals are received and stored in said digital buffer after detecting said activation signal.

13. A method as in claim 1 wherein GPS signals are received through a GPS RF downconverter and digitized by an analog-to-digital (A/D) converter and stored in a digital buffer after detecting said activation signal, and wherein said GPS RF downconverter and said A/D converter are placed in a low power state after digitized representations of said GPS signals are stored in said digital buffer.

14. A method as in claim 13 wherein a predetermined amount of said digitized representations of said GPS signals are stored in said digital buffer.

* * * * *